United States Patent [19]
Sato

[11] Patent Number: 5,242,849
[45] Date of Patent: Sep. 7, 1993

[54] METHOD FOR THE FABRICATION OF MOS DEVICES

[75] Inventor: Yasuo Sato, Sagamihara, Japan

[73] Assignee: Nippon Steel Corporation, Tokyo, Japan

[21] Appl. No.: 887,009

[22] Filed: May 22, 1992

[30] Foreign Application Priority Data

May 24, 1991 [JP] Japan .................. 3-149432

[51] Int. Cl.$^5$ .......................... H01L 21/76
[52] U.S. Cl. .................... 437/44; 437/69; 437/70
[58] Field of Search ............ 437/69, 940, 70, 44; 148/DIG. 85, DIG. 86, DIG. 117

[56] References Cited

FOREIGN PATENT DOCUMENTS

| | | |
|---|---|---|
| 58-186968 | 11/1983 | Japan ............................ 437/70 |
| 63-198383 | 8/1988 | Japan . |
| 63-302536 | 12/1988 | Japan . |
| 2-122669 | 5/1990 | Japan . |
| 2-309665 | 12/1990 | Japan . |

*Primary Examiner*—George Fourson
*Attorney, Agent, or Firm*—Cushman, Darby & Cushman

[57] ABSTRACT

After the formation of SiO$_2$ films that are field oxide films and P$^+$-type diffusion layers that are stopper channels, the Si$_3$N$_4$ films are subjected to an isotropic etching process, thereby removing the regions adjacent to the edges of the SiO$_2$ films of the Si$_3$N$_4$ films. By using the Si$_3$N$_4$ and SiO$_2$ films as a mask, N-type impurities are implanted into the Si substrate adjacent to the edges of the SiO$_2$ films. Then the P$^+$-type diffusion layers disappear adjacent to the edges of the SiO$_2$ films and the P$^+$-type diffusion layers are isolated from the N$^+$-type diffusion layers, whereby semiconductor devices that are faster and are highly reliable and dependable in operation can be fabricated.

12 Claims, 3 Drawing Sheets

METHOD FOR THE FABRICATION OF MOS DEVICES

BACKGROUND OF THE INVENTION

1. Field of the Invention

The present invention relates to a method for the fabrication of MOS devices of the type in which elements are isolated from each other by field oxide films and channel stoppers.

2. Description of the Related Art

In monolithic ICs, it is necessary to electrically isolate a large number of elements from each other that are arranged on a single semiconductor chip. One of the typical electrical isolation techniques is the dielectric isolation technique, the most typical of which is the LOCOS method, which electrically isolates circuit elements by field oxide films.

Furthermore, a channel stopper that is a highdensity impurity doped diffusion layer having the same conductivity as a semiconductor substrate is formed below a field oxide film so that the threshold voltage of a parasitic MOS transistor, whose channel region exists below the field oxide film, becomes higher than the potential of an interconnection over the field oxide film to cut off the parasitic MOS transistor within the IC driving voltage completely, and thereby ensure electrical isolation among the circuit elements.

FIG. 2 illustrates the steps of a prior art method for the fabrication of a semiconductor device in which electric isolation among the circuit elements is effected by field oxide films and channel stoppers and MOS transistors are created in the element regions surrounded by the field oxide films.

According to this prior art method, as shown in FIG. 2(a), first a $SiO_2$ film 12 for padding is formed over the surface of a p-type Si wafer 11 and then a $Si_3N_4$ film 13, approximately 1000 to 3000 Å in thickness, is deposited on the $SiO_2$ film 12 and is patterned to define the region of elements to be fabricated.

Next, as shown in FIG. 2(b), a p-type impurity or dopant, such as $BF_2$ 14, is diffused at a rate of about $1 \times 10^{13} - 1 \times 10^{14}$ cm $^{-2}$ into the Si wafer 11 by using the $Si_3N_4$ film 13 as a mask by ion implantation.

Thereafter, the semiconductor structure thus obtained is subjected to thermal oxidation so that the $Si_3N_4$ film 13 becomes an antioxidant film as shown in FIG. 2(c) and the regions of the Si substrate 11 unmasked by the $Si_3N_4$ film 13 are selectively oxidized to form $SiO_2$ films 15 that are field oxide films.

Meanwhile, the ion-implanted impurities 14 in the Si wafer are diffused by heat dissipated in the thermal oxidation process so that p+-type diffusion layers 16 are formed below the $SiO_2$ films 15 in selfalignment therewith and simultaneous with the formation thereof.

Next, as shown in FIG. 2(d), $Si_3N_4$ film 13 and $SiO_2$ films 12 are removed so that a $SiO_2$ film 17 that becomes a gate oxide film is formed over the element region surrounded by the $SiO_2$ films 15. Thereafter, a polycrystalline Si film 18 is deposited on the $SiO_2$ films 17 and 15 and is patterned in the form of a gate electrode.

In the succeeding step, high-density ion-implantation of an N-type impurity, such as arsenic, into the Si wafer is carried out by using the polycrystalline Si film 18 and the $SiO_2$ films 15 as a mask. Next the semiconductor structure thus obtained is subjected to a heat treatment to diffuse the implanted impurities. Then, N+-type diffusion layers 19 that become a source and a drain, respectively, are formed in a self-alignment relationship with the polycrystalline Si film 18, whereby a MOS transistor generally indicated by the reference numeral 20 is fabricated.

The actual MOS transistor fabrication process further includes the step of forming an interconnection and the step of forming a passivation film, but these steps shall not be described in this specification because they are not a function of the present invention.

However, in the semiconductor device fabricated by the prior art method described above, the P+-type diffusion layer 16 extends to the edge of the $SiO^2$ film 15 and makes contact with the N+-type diffusion layer 19 as best shown in FIG. 2(d). As a result, when the amount of dopant is increased excessively in order to raise the threshold value of a parasitic MOS transistor by utilizing the stopper channels, the dopant density of the P+-type diffusion layer 16 is also increased at the junction.

As a consequence, the junction capacitance between the P+-type diffusion layer 16 and the P+-type diffusion layer 19 is increased so that the speed of the MOS transistor 20 is decreased. In addition, the breakdown voltage of the junction between the P+-type diffusion layer 16 and the N+-type diffusion layer 19 drops so that reliability of the MOS transistor 20 is adversely affected.

Furthermore, when the P+-type diffusion layer 16 extends towards the edge of the N+-type diffusion layer 15, the channel contraction effect occurs in the MOS transistor 20 so that the threshold voltage of the transistor 20 becomes higher. This is another reason why the speed of the MOS transistor 20 becomes slow.

In view of the above, the primary object of the present invention is to provide a method for the fabrication of MOS devices which are fast and highly reliable in operation.

SUMMARY OF THE INVENTION

To attain the above and other objects, the present invention provides a method for the fabrication of MOS devices comprising a first step of forming a predetermined pattern of antioxidant film over the surface of a semiconductor wafer a second step of forming field oxide films for electrical isolation of circuit elements on said semiconductor substrate by using said antioxidant film formed in said first step as a mask a third step of forming below said field oxide films formed in said second step channel stoppers diffused with impurities of the same conductivity as that of said semiconductor wafer at a concentration higher than that of the impurities diffused into said semiconductor wafer a fourth step of removing the edges of said antioxidant films formed in said first step and a fifth step of diffusing the impurities of the conductivity opposite those diffused in said channel stoppers into said semiconductor substrate by using said antioxidant films remaining after said fourth step and said field oxide films as a mask.

It is preferable that said second step further includes a step for diffusing $BF_2$ ions into said semiconductor substrate by using said antioxidant films as a mask and subjecting said semiconductor substrate to thermal oxidation, thereby creating said field oxide films. It is further preferable that said second step includes a step for diffusing boron ions into said semiconductor substrate by using said antioxidant films as a mask and then subjecting said semiconductor substrate to thermal oxidation, thereby creating said field oxide films.

It is also preferable that said second step includes a step for creating said channel stoppers below said field oxide films by thermal diffusion simultaneous with the formation of said field oxide films.

In addition, it is preferable that said fourth step includes an isotropic etching step for removing the portions adjacent to the edge portions of said field oxide films of said antioxidant films.

It is also preferable that said fourth step is for selectively etching the surfaces of said field oxide films by a photolithographic process to remove the portions adjacent to the edge portions of said field oxide films of said antioxidant films.

It is further preferable that said fourth step includes a step for selectively removing the portions of said antioxidant films covered by said field oxide films.

Furthermore it is preferable that said fifth step includes a step for diffusing said impurities of opposite conductivity into said channel stoppers to eliminate a portion of the same adjacent to the edge portions of said field oxide films and isolating the same from the active regions.

It is also preferable that, in the fifth step, phosphorus ions are implanted as impurities into said semiconductor substrate.

It is preferable that, in the fifth step, arsenic ions are implanted as impurities into said semiconductor substrate.

Moreover, in said first step, it is preferable that said antioxidant films include $Si_3N_4$ films.

It is also preferable that, in the first step, said antioxidant films include a compound film consisting of $Si_3N_4$ and polycrystalline silicon films.

In the case of the method for the fabrication of MOS devices in accordance with the present invention, the impurities having conductivity opposite to that of the impurities diffused in the channel stoppers are diffused in the semiconductor substrate adjacent to the edge portions of the field oxide films. As a consequence, the impurities constituting the channel stoppers are compensated by the impurities thus diffused so that even when the impurity concentration of the channel stopper at the center portion of the field oxide film is high, the impurity concentration of the channel stopper adjacent to the edge of the field oxide film is low.

Furthermore in the case of the method for the fabrication of MOS devices in accordance with the present invention, even when the impurity concentration is high at the center portion of the field oxide film, the impurity concentration in the channel stopper adjacent to the edge portion of the field oxide film is such that when a layer of impurities whose polarity is opposite that of the channel stopper is formed in an element region, the coupling capacitance between the layer diffused with the impurities and the channel stopper is low the junction breakdown voltage becomes higher and the channel contraction effect can be prevented. Thus, the present invention can provide a method for the fabrication of MOS devices that are fast and are highly reliable and dependable in operation.

DESCRIPTION OF THE PREFERRED EMBODIMENTS

Referring now to FIG. 1, a preferred embodiment of a method in accordance with the present invention for the fabrication of a semiconductor device containing MOS transistors will be described in detail.

Figure 1A:
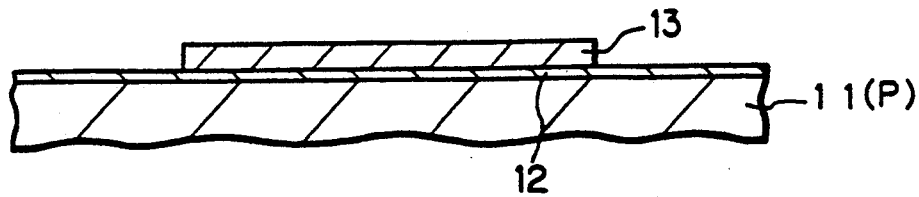
FIGS. 1(a)-(g) are schematic side sectional views illustrating the sequence of steps of an embodiment of the present invention.
Figure 1B:
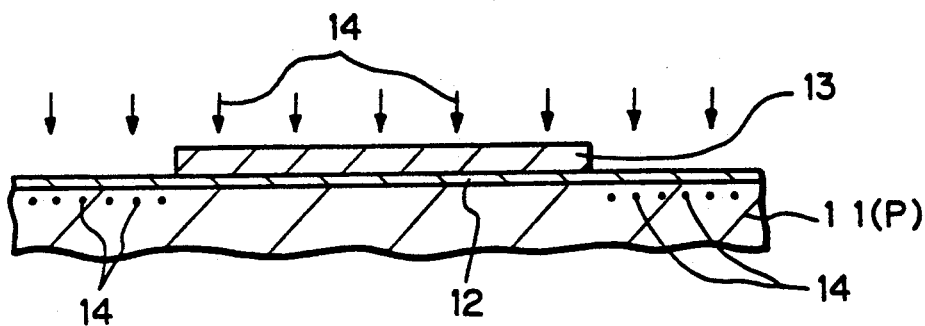
Figure 1C:
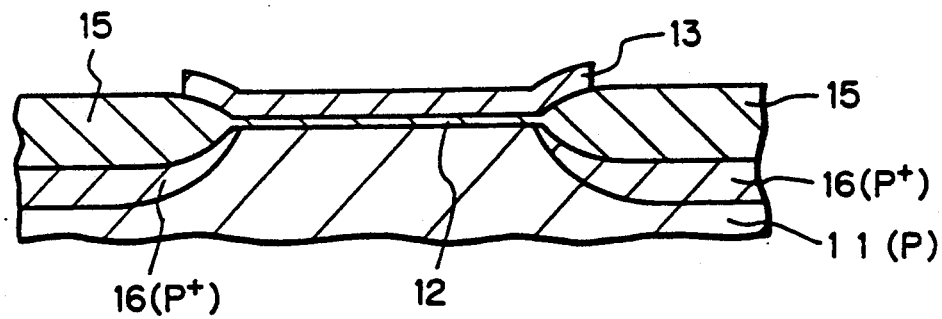

In this embodiment, the steps shown in FIGS. 1(a)-(c) of forming $SiO_2$ films that are field oxide films 15 and P+-type diffusion layers 16 are substantially similar to those described above with reference to FIG. 2.

More particularly, first, as shown in FIG. 1(a), a padding $SiO_2$ film 12 is formed over the surface of a p-type Si substrate 11 and then a $Si_3N_4$ film about 1000-3000 Å in thickness is deposited on the $SiO_2$ film 12. Next the $Si_3N_4$ film 13 is patterned to define the circuit element regions.

Thereafter, as shown in FIG. 1(b), p-type impurities 14 such as $BF_2$ are implanted into the Si substrate 11 with the doping density of the order of $1 \times 10^{13} - 1 \times 10^{14}$ cm$^{-2}$ by using the $Si_3N_4$ film as a mask.

Next the semiproduct thus fabricated is subjected to thermal oxidation so that, as best shown in FIG. 1(c), the $Si_3N_4$ film becomes an antioxidant film and the region of the Si substrate 11 that is not masked by the $Si_3N_4$ film 13 is selectively oxidized, forming $SiO_2$ films 15 that are field oxide films. Meanwhile, the impurities 14 implanted into the Si substrate 11 are diffused by thermal oxidation so that P+-type diffusion layers 16 are formed below these $SiO_2$ films respectively as channel stoppers 16 in a self-alignment relationship with $SiO_2$ films 15 simultaneous with the formation thereof.

Figure 1D:
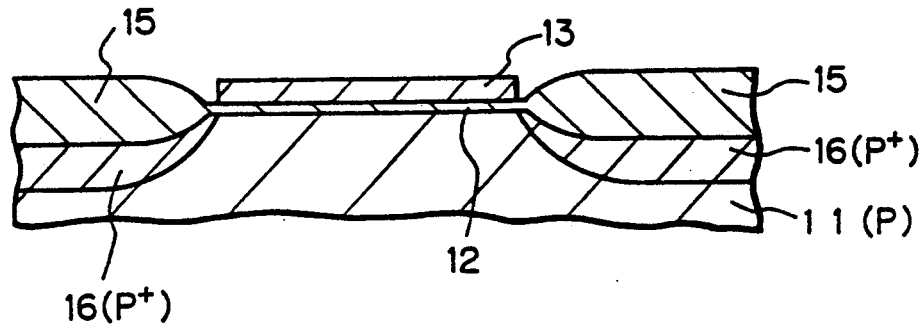

Thereafter, the $Si_3N_4$ film 13 is partially etched by, for instance, isotropic etching. The surface of the $Si_3N_4$ film 13 is etched, as best shown in FIG. 1(d), so that its thickness is decreased. The side surfaces of the $Si_3N_4$ film 15 are also etched so that the regions adjacent to the edge of the $SiO_2$ film 15 of the $Si_3N_4$ film 13 are removed.

The $Si_3N_4$ film 13 is etched by an isotropic dry etching process that facilitates the retraction of the sides of the $Si_3N_4$ film 13. The dry etching is carried out, for instance, under the condition that $SF_6$ gas is used at the flow rate of 60 ml/min and the etching pressure is maintained at 0.7 Torr and the RF power at 150 W.

Figure 1E:
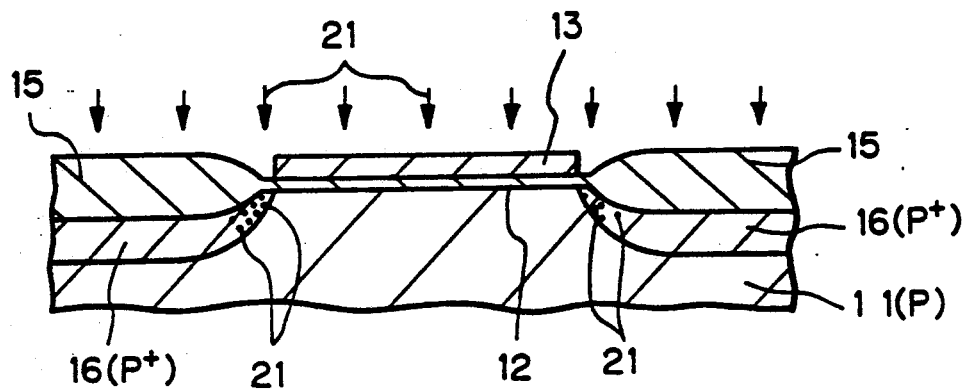

Next, as best shown in FIG. 1(e), by using the $Si_3N_4$ film 13 and the $SiO_2$ films 15 as a mask, n-type impurities such as arsenic, phosphorus or the like are implanted with the doping density of the order of from $1 \times 10^{13} - 1 \times 10^{14}$ cm$^{-2}$ into the Si substrate 11 adjacent to the edge of the $SiO_2$ film 15.

Figure 1F:
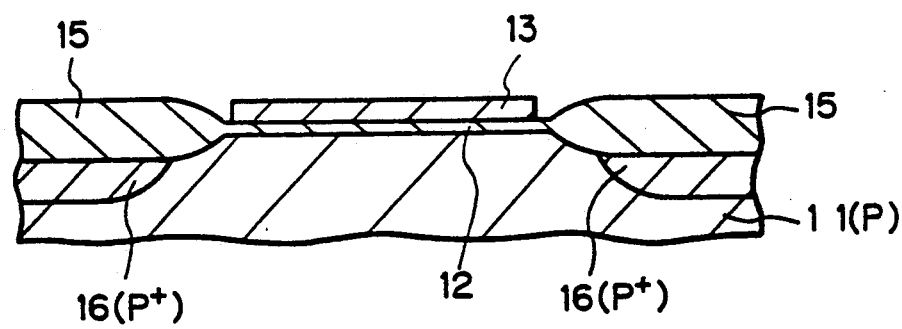

Thereafter, as shown in FIG. 1(f), a $SiO_2$ film 17 that is a gate oxide film, a polycrystalline Si film 18 that is a gate electrode and N+-type diffusion layers 19 that are a source and a drain, respectively, are formed. Thus, a MOS transistor generally designated by the reference numeral 20 is fabricated.

In this embodiment, the polarities of impurities 21 and 14 are opposite and the amount of impurities 21 doped is substantially equal to the amount of impurities 14 doped. It follows therefore that, when the impurities 21 simultaneously form the N+-type diffusion layers 19 by heat treatment, the impurities 14 are substantially compensated for at the compensation rate of approx. 1 at the regions into which the impurities 21 are diffused and which are adjacent to the sides of the SiO₂ film 15.

Figure 1G:
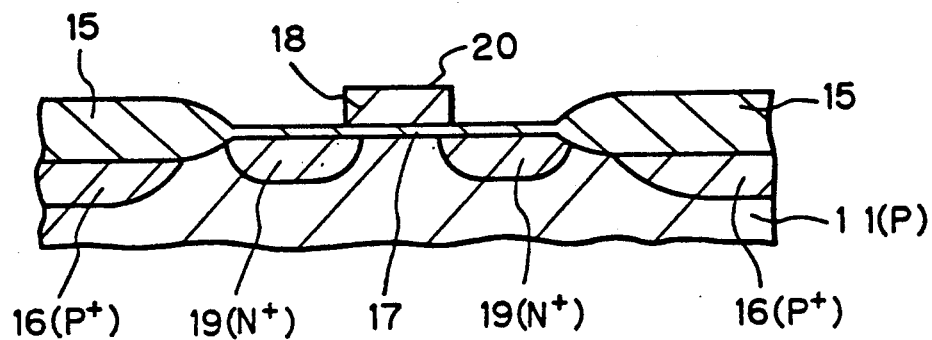
Figure 2A:
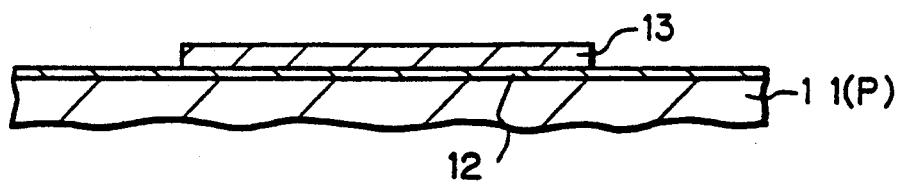
FIGS. 2(a)-(d) are schematic side sectional views illustrating the sequence of steps of the prior art method for the fabrication of MOS devices.
Figure 2B:
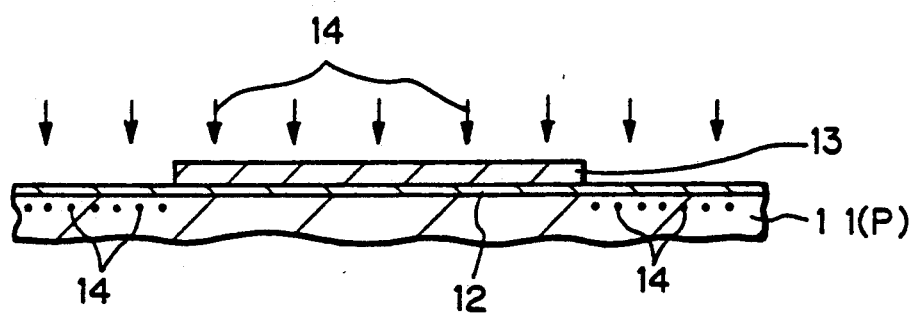
Figure 2C:
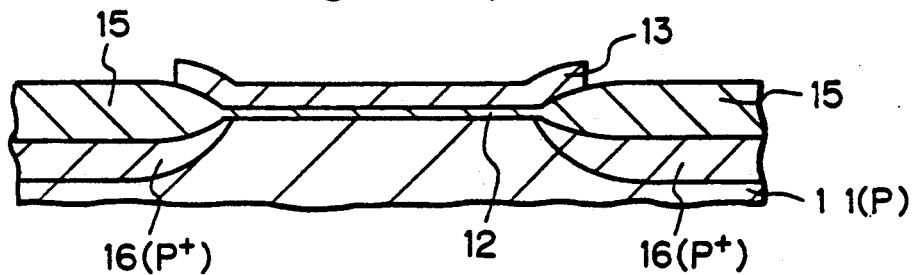
Figure 2D:
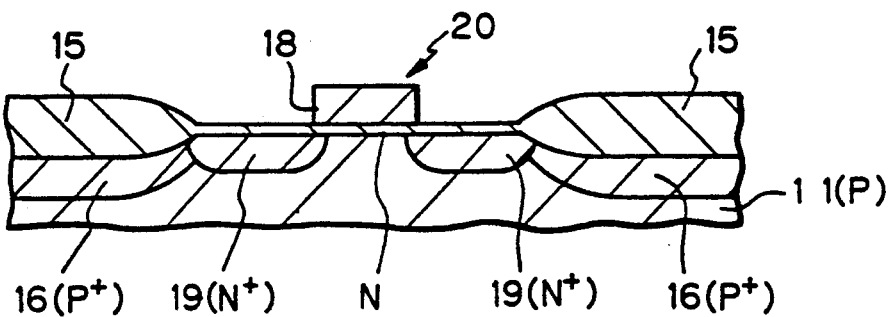

As a consequence, as shown in FIG. 1(g), the channel stoppers or P+ diffusion layers 16 disappear at the regions adjacent to the sides of the SiO₂ film 15 and are isolated from the N+ diffusion layers 19. As a result, the coupling capacitance between the P+ diffusion layer and the N diffusion layer 19 becomes small the junction breakdown voltage becomes higher and the narrow channel effect can be suppressed in the MOS transistor 20.

As described in detail above, with the method for the fabrication of semiconductor devices in accordance with the present invention, even when the impurity concentration of the channel stopper is high at the center portion of the field oxide film, the impurity concentration of the channel stopper is low at the region adjacent to the edge of the field oxide film so that when the impurity diffusion layer with a polarity opposite that of the channel stopper is formed in the element region, the coupling capacitance between such impurity diffusion layers and the channel stopper is low the junction breakdown voltage is higher and the channel contraction effect can be suppressed. Thus, semiconductor devices that are faster and are highly reliable and dependable in operation can be fabricated.

I claim:

1. A method of fabrication of MOS devices characterized by comprising a first step for writing a predetermined pattern of antioxidant film on a semiconductor substrate;

a second step for forming, by using said antioxidant film formed in said first step as a mask, field oxide films for electrical isolation of circuit elements on said semiconductor substrate;

a third step for forming channel stoppers below said field oxide films formed in said second step; the concentration of impurities of the same conductivity type as said semiconductor substrate in said channel stoppers being higher than that of said semiconductor substrate;

a fourth step for removing the edges of said antioxidant film formed in said first step, thereby leaving a portion of said antioxidant film remaining; and a fifth step for diffusing or implanting the impurities of conductivity type opposite that of said impurities in said channel stoppers into said semiconductor substrate by using the remaining portion of said antioxidant film not removed by said fourth step and using said field oxide films as masks.

2. A method for the fabrication of MOS devices as defined in claim 1, characterized in that in said second and third steps of said method, BF₂ is implanted into said semiconductor substrate by using said antioxidant film as a mask and said BF₂ implanted semiconductor substrate is subjected to thermal oxidation, thereby forming said field oxide films.

3. A method for the fabrication of MOS devices as set forth in claim 1, characterized in that in said second and third steps of said method, by using said antioxidant film as a mask, boron is implanted into said semiconductor substrate and said boron implanted semiconductor substrate is subjected to thermal oxidation, thereby forming said field oxide films.

4. A method for the fabrication of MOS devices as defined in claim 1, characterized in that said second and third steps of said method includes a step for forming said channel stoppers below said antioxidant film by thermal diffusion simultaneous with the formation of said field oxide films.

5. A method for the fabrication of MOS devices as defined in claim 1, characterized in that said fourth step for removing the edges of said antioxidant film includes an isotropic etching process.

6. A method for the fabrication of MOS devices as defined in claim 1, characterized in that said fourth step of said method for removing the edges of said antioxidant film further includes a step for carrying out selective etching of said field oxide films by a photolithographic technique.

7. A method for the fabrication of MOS devices as defined in claim 1, characterized in that said fourth step of said method includes a step for selectively removing the region of said antioxidant film covering said field oxide films.

8. A method for the fabrication of MOS devices as defined in claim 1, characterized in that said fifth step of said method includes a step for diffusing or implanting said impurities of opposite conductivity type into said semiconductor substrate to eliminate a part of said channel stoppers adjacent to said field oxide films, thereby isolating the channel stoppers from active regions.

9. A method for the fabrication of MOS devices as defined in claim 1, characterized in that in said fifth step of said method, phosphorus ions are implanted as said impurities into said semiconductor substrate.

10. A method for the fabrication of MOS devices as defined in claim 1, characterized in that in said fifth step of said method, arsenic ions are implanted as said impurities into said semiconductor substrate.

11. A method for the fabrication of MOS devices as defined in claim 1, characterized in that in said first step of said method, said antioxidant film contains a $Si_3N_4$ film.

12. A method for the fabrication of MOS devices as defined in claim 1, characterized in that in said first step of said method, said antioxidant film includes a compound film consisting of a $Si_3N_4$ film and a polycrystalline silicon film.

* * * * *